(12) United States Patent
Brand

(10) Patent No.: US 7,160,127 B2
(45) Date of Patent: Jan. 9, 2007

(54) VARIABLE LATCH

(75) Inventor: Jason M. Brand, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/391,893

(22) Filed: Mar. 18, 2003

(65) Prior Publication Data
US 2004/0183558 A1   Sep. 23, 2004

(51) Int. Cl.
*H01R 13/62* (2006.01)
(52) U.S. Cl. ...................................... 439/330
(58) Field of Classification Search ........ 324/750–765; 439/439, 331, 33, 73
See application file for complete search history.

(56) References Cited

U.S. PATENT DOCUMENTS 4,076,204 A * 2/1978 Kalka ..................... 248/500
4,241,966 A * 12/1980 Gomez ..................... 439/157
4,330,163 A * 5/1982 Aikens et al. .............. 439/71
4,378,139 A * 3/1983 Griffin et al. .............. 439/331
4,601,525 A * 7/1986 Kandybowski ............ 439/329
4,621,884 A * 11/1986 Berkebile et al. .......... 439/367
5,145,395 A * 9/1992 Kuei Lai ................... 439/326
5,273,441 A * 12/1993 Volz et al. .................. 439/72
5,748,007 A * 5/1998 Gaschke .................... 324/755
6,094,057 A * 7/2000 Hiruta et al. ............... 324/755
6,267,603 B1 * 7/2001 Yamamoto et al. .......... 439/70
6,514,097 B1 * 2/2003 Conroy ..................... 439/330
6,848,928 B1 * 2/2005 Ikeya et al. ................ 439/331

* cited by examiner

*Primary Examiner*—Neil Abrams
(74) *Attorney, Agent, or Firm*—Schwegman, Lundberg, Woessner & Kluth, P.A.

(57) ABSTRACT

Numerous embodiments of variable latch and a method of formation are disclosed. One or more embodiments of the claimed subject matter may comprise a latch with a plurality of contact points formed thereon, and method of fabrication. The plurality of contact points may allow adequate socketing of microelectronic packages of varying sizes in a socket assembly, without the need to modify the latch when the microelectronic package size varies.

40 Claims, 4 Drawing Sheets

VARIABLE LATCH

BACKGROUND

As part of the design and development of microelectronic devices, a screening and testing operation may be performed in order to detect and remove defective microelectronic devices. In one particular operation, a burn-in stress test may be performed, where devices may be operated in elevated voltage and/or temperature states. Operations such as this may be performed on several devices in parallel, and all or part of the operation may be automated, such as the socket insertion and removal process for a particular device. When a device is inserted in a socket, one or more latches, or packet retaining devices, may automatically latch on the device, and hold the device with sufficient force to ensure contact with the socket. When the operation is complete, the latch may be configured to release the device so that it may be removed by one or more additional automated mechanisms such as a pick and place mechanism. This particular type of socket that allows for automated insertion and/or removal of a package may be referred to in some contexts as a self-captivating socket.

FIG. 3 illustrates an assembly 200 comprising a microelectronic device, illustrated as microelectronic package 218. Package 218 is shown in contact with a socket 220, which may be part of a testing environment such as a burn in environment. As shown in FIG. 3, when latch 202 is engaged, or latched, to the device 218, the latch contact point 206 may contact the package. A spring such as spring 222 may cause latch 202 to exert a substantially vertical force on the package 218, which may be referred to as socketing force. Adequate socketing force may result in electrical contact being made between device 218 and socket 220. Latch 202 may comprise a lever arm 204, a contact point 206 located on the lever arm, and a fixed pivot point 214, which may also be referred to as a fulcrum. Pivot point 214 may be configured such that latch 202 is capable of rotating about an axis at least partially defined by the pivot point. A notched tab 212 may be located opposite pivot point 214 from the lever arm 204. Notched tab may have an actuating arm 210 attached, and a cover 208 attached to the actuating arm 210. Cover 208, which may also be referred to as an open top lid, may be coupled to one or more springs 222 that exert force on the cover.

In operation, a package may be inserted into socket 220 in the following manner: Cover 208 may be forced downwards by an insertion tool (not shown), which, due to the configuration of the actuating arm and the notched tab, will cause latch 202 to rotate about the axis defined by pivot point 214. A package, such as package 218, may be inserted into socket 220. Force may be removed from cover 208, and this will result in latch 202 rotating to make contact with and apply force to package 218 on contact point 206, due at least in part to the force exerted by one or more springs 222 on cover 208. The force applied by latch 202 may be a substantially vertical force, and may provide electrical contact between package 218 and socket 220. However, depending on the dimensions of the microelectronic package 218, latch 202 may not provide adequate force to ensure contact between the socket and the package. Additionally, while sockets used in a testing environment may be configured to receive packages of varying sizes, a latch such as latch 202 may not be sufficient for use in testing devices of varying sizes, and when testing devices of varying sizes, latches may have to be changed between tests.

Therefore, it would be advantageous to develop a latch that may be used in environments such as testing environment, that are capable of providing adequate socketing force and sufficient contact points for socketing of packages with varying sizes, thereby reducing or eliminating the need to alter or modify a latch when the package size varies.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise a variable latch and a method of fabrication. One particular embodiment of the claimed subject matter may comprise a latch with a plurality of contact points formed thereon. The plurality of contact points may allow adequate socketing of microelectronic packages of varying sizes in a socket assembly, without the need to modify the latch.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 1A:
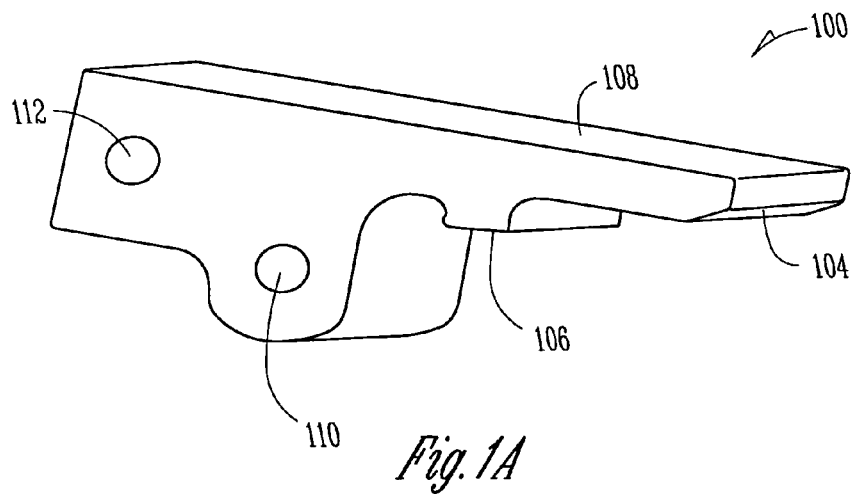
FIG. 1a is an oblique view of a first embodiment of a latch and microelectronic package, according to the present invention.

Referring now in detail to the drawings wherein like parts are designated by like reference numerals throughout, there is illustrated in FIG. 1a an oblique view of a first embodiment of a latch in accordance with one embodiment of the claimed subject matter. Illustrated in FIG. 1a is a latch 100. Latch 100 maybe comprised of a latch arm 108, a notched tab 112, pivot point 110, and contact points 106 and 104, but it is important to note that latch 100 is not limited to just this particular configuration, but may comprise any latch with a plurality of contact points, for example. The latch shown in FIG. 1a may be formed of a plastic or vinyl composition, or may be formed from a heat resistant composition including carbon based glass-filled plastics such as PES (Polyethylene Styrene) or PEI (Polyetherimide) for example, but the claimed subject matter is not so limited. A latch such as latch 100 may be formed from one or more injection molding processes, or one or more machining processes, but it is important to note that the claimed subject matter is not limited in this respect, and any fabrication process that results in the fabrication of a latch with a plurality of contact points is in accordance with the claimed subject matter. Additionally, dimensions of the latch may depend on the particular application the latch will be utilized in, such as part of a burn in socket assembly for flash memory devices, but it is envisioned that one possible embodiment would utilize a latch approximately 10 millimeters in length.

Figure 1B:
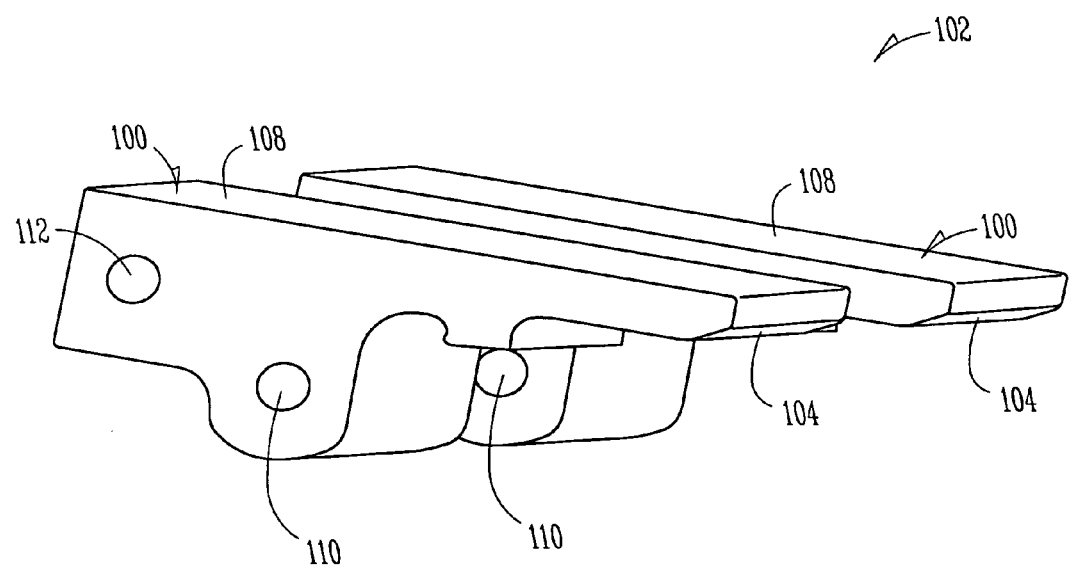
FIG. 1b is an oblique view of a first embodiment of two latches each having two contact points formed thereon, according to the present invention.
Figure 2A:
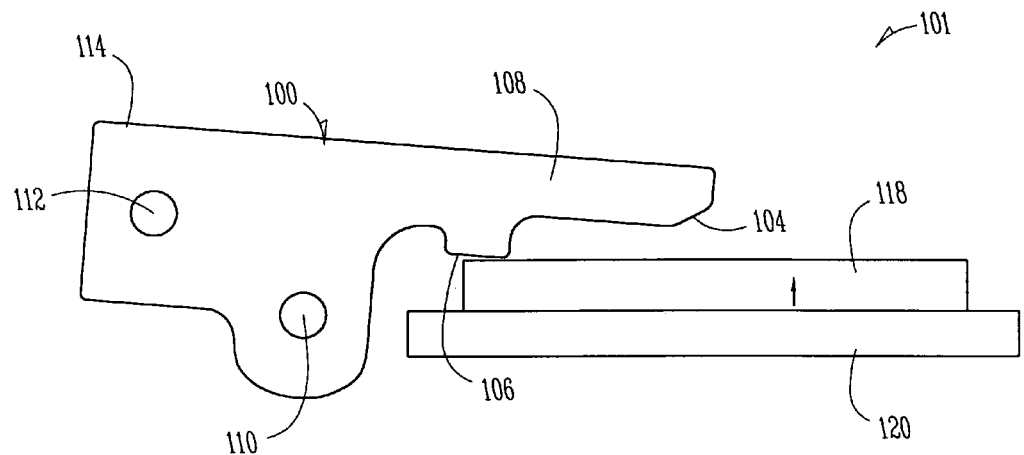
FIG. 2a and 2b are side cross-sectional views of a first embodiment of a latch and socketing assembly, according to the present invention.
Figure 2B:
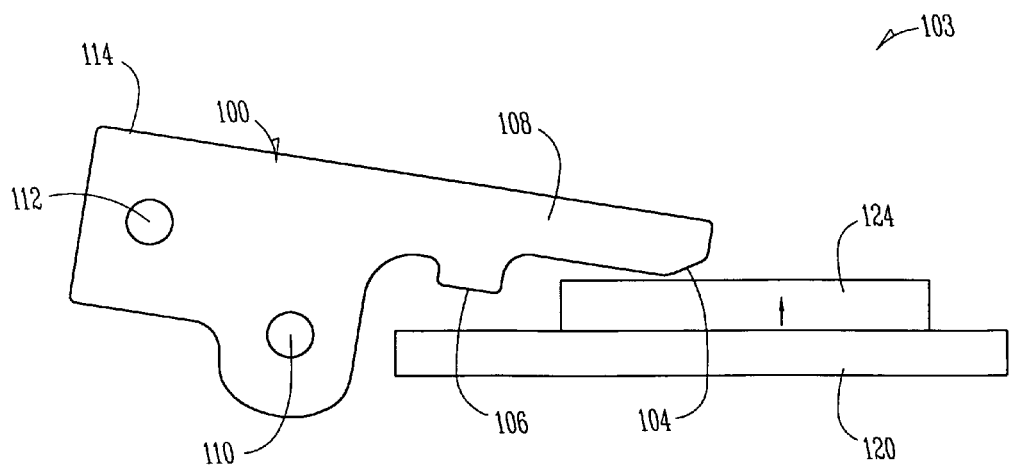
Figure 3:
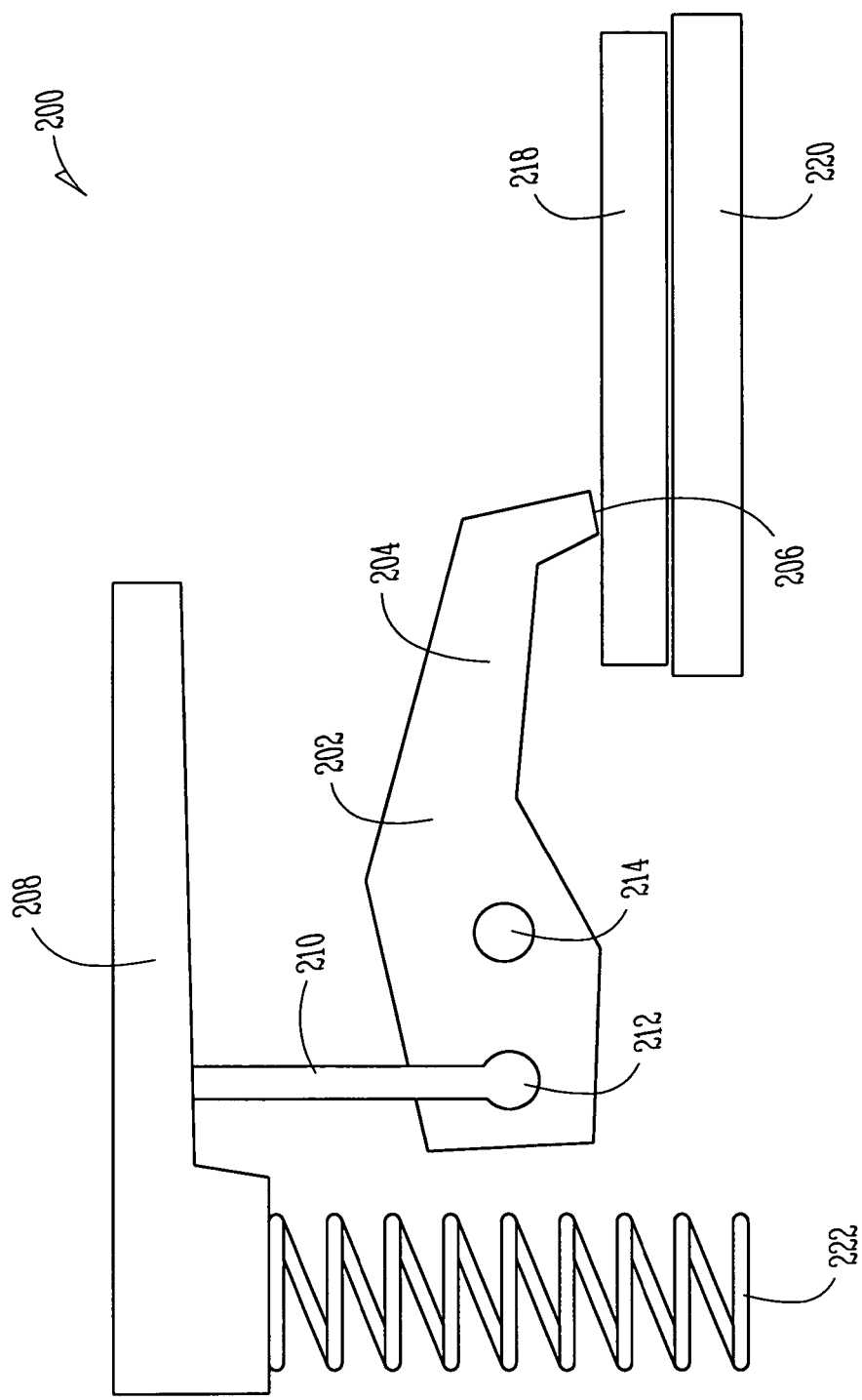
FIG. 3 is a side cross-sectional view of a latch and socketing assembly, as known in the art.

Shown in FIGS. 2a and 2b are two possible applications of a latch as illustrated in FIG. 1a. Shown in FIGS. 2a and 2b are two latches utilized in socketing assemblies, which may be part of a testing environment such as a burn in environment, for example. In one embodiment, the socket assemblies illustrated may be referred to as self-captivating sockets, but those of skill in the art will understand that the claimed subject matter is not limited to any particular type or category of socket or socketing assembly, but any type of device that is configured to provide a contact interface between two or more electronic devices is in accordance with at least one embodiment of a socket or socketing assembly. FIG. 2a illustrates a latch 100 comprising part of assembly 101, but in alternative configurations, multiple latches are used in an alternate socketing assembly 102 shown in FIG. 1b, and the depiction of a single latch is shown here for the purpose of illustration. Latch 100 comprises a latch arm 108, a notched tab 112, pivot point 110, and contact points 106 and 104. In this particular configuration, latch contact point 106 in shown as being in contact with package 118. In this configuration, latch 100 may be providing socketing force, which may comprise a substantially vertical force, for package 118. Force may be provided by use of one or more springs (not shown), which may be coupled to the latch, and may provide a substantially vertical downward force on the latch resulting in socketing force being applied to package 118. In a socketing assembly such as assembly 101, the amount of mechanical force applied by the latch to the package may depend on the contact point in contact with a device, since this will result in a particular moment arm length. Additionally, latch timing may be affected by the contact point in contact with a device. Latch timing, in this embodiment, is the time duration required for a latch to remove force from a device relative to the motion of one or more other components of a socketing assembly such as a cover (not shown).

Typically, socketing force applied by a latch may vary depending on the particular device and/or socket configuration, but the claimed subject matter is not limited in this respect. In this embodiment, the application of socketing force by latch 100 on device 118 may result in electrical continuity being provided between package 118 and socket 120. Illustrated in this embodiment is a microelectronic package 118, which may comprise, for example, a microprocessor package, but it is important to note that package 118 is not so limited. Package 118 may comprise any sort of microelectronic device including an ASIC, flash memory, or any chip scale package such as a folded stack chip scale package, for example.

A notched tab 112 may be formed on the body of latch 100, and may be formed opposite the pivot point from lever arm 108. This particular configuration may allow rotation of the latch 100 about pivot point 110 when force is applied to notched tab 112. An actuating arm (not shown) may be coupled to notched tab 112, and the actuating arm may be coupled to a lid (not shown) when installed in a testing apparatus. However, the claimed subject matter is not limited to use of a notched tab, or use of an opposing lever configuration to allow rotation about pivot point 110. For example, force could be applied upwards on lever arm 108 to remove the latch from contact with a package, and in this configuration no notched tab may be required. Additionally, force may be applied to the latch in the vicinity of top surface 114 in order to provide the necessary force to rotate the latch about pivot point 110, although, again, the claimed subject matter is not so limited.

FIG. 2b illustrates a second socketing assembly that may incorporate a latch such as latch 100. As shown in FIG. 2b, latch 100 is being utilized in a socketing assembly where a larger package than that illustrated in FIG. 2a is being socketed. In this embodiment, latch 100 comprises a latch arm 108, a notched tab 112, pivot point 110, and contact points 106 and 104. In this particular configuration, latch 100 is shown as having the contact point 106 in contact with a package 124. In this configuration, latch 100 may be providing socketing force for package 124 by use of one or more springs (not shown). This may result in electrical continuity being provided between package 124 and socket 120. Illustrated in this embodiment is a microelectronic package 124, which may comprise, for example, a microprocessor package, but, again, it is important to note that package 124, similarly to package 118, is not so limited, and may include, for example, any chip scale package such as a folded stack chip scale package.

Shown in FIGS. 2a and 2b are two uses of latch 100 in socketing assemblies. These configurations demonstrate that a latch such as latch 100 may be used to socket microelectronic devices of a variety of sizes. It is important to note, however, that while latch 100 is shown as having two contact points 104 and 106, the claimed subject matter is not so limited, but may comprise a latch with multiple contact points. Those of skill in the art will appreciate that the amount of contact points and configuration of a latch such as latch 100 may depend at least in part on the chosen application. For example, a latch with three contact points may be capable of latching devices of a greater variety than a latch with two contact points. Additionally, differing devices may require differing socketing forces, depending on the configuration of the device. Differing configurations of a latch such as latch 100 may be determined based at least in part on the socketing force required by devices that will be socketed by a latch in accordance with one or more embodiments disclosed herein.

Figure 4:
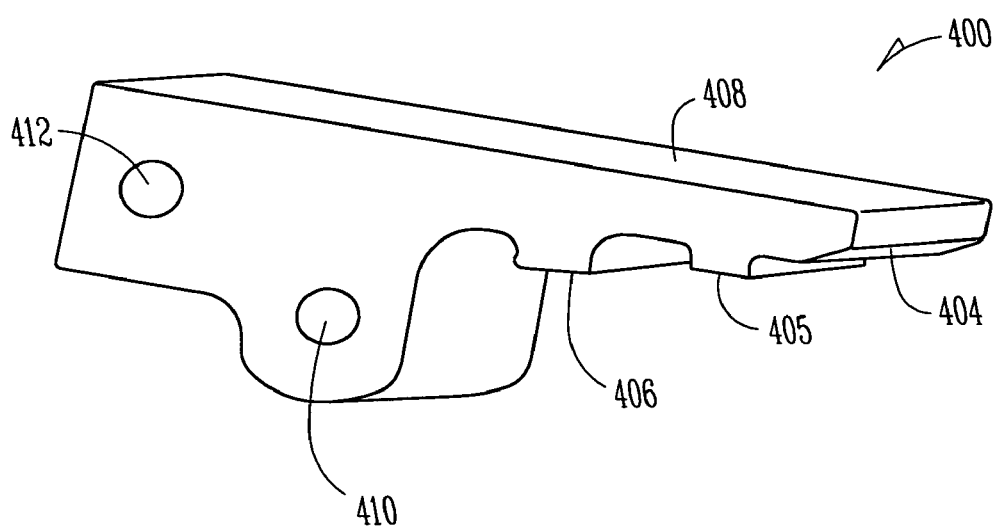
FIG. 4 is an oblique view of an embodiment of a latch according to the present invention.

Shown in FIG. 4 is an oblique view of an embodiment of a latch in accordance with another embodiment of the claimed subject matter. Illustrated in FIG. 4 is a latch 400. Latch 400 may be comprised of a latch arm 408, a notched tab 412, pivot point 410, and contact points 406, 405, and 404.

It can be appreciated that the embodiments may be applicable to latches or anywhere a variable latch may be desirable. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of the embodiments of the claimed subject matter.

The invention claimed is:

1. A latch for use with a socket for receiving variably sized microelectronic devices, the latch comprising:
   a body;
   a tab formed on the body;
   a lever arm formed on the body, wherein the lever arm is formed substantially opposite said tab;
   a fixed pivot point formed on the body; and
   a plurality of contact points formed on the lever arm, each contact point to be in contact with and to apply a force to a specifically sized microelectronic device located on the socket when the other contact points are not in contact with the microelectronic device.

2. The latch of claim 1, wherein the latch is substantially formed from glass-filled plastic.

3. The latch of claim 1, wherein said latch is configured to provide socketing force to a microelectronic package.

4. The latch of claim 1, wherein said latch has two contact points.

5. The latch of claim 1, wherein said plurality of contact points are configured to socket microelectronic devices of different physical dimensions.

6. The latch of claim 1, further including one or more springs coupled to said body, an actuating arm coupled to said body, and a lid coupled to said actuating arm.

7. The latch of claim 1, wherein said latch is one component of a bum-in socket assembly.

8. The latch of claim 1, further comprising a spring coupled to the tab to cause the lever arm to apply a substantially vertical force to the microelectronic device to hold the microelectronic device on the socket with electrical continuity between the microelectronic device and the socket.

9. The latch of claim 1, wherein said pivot point is formed on said body between said tab and said lever arm.

10. The latch of claim 1, wherein said contact points comprise a first contact point and a second contact point, the first contact point being located between the pivot point and the second contact point.

11. An assembly for receiving variably sized microelectronic packages comprising:
    a latch comprising:
       an arm;
       a first contact point on the arm;
       a second contact point on the arm;
       a pivot point, the arm being rotatable about the pivot point, the first contact point being located between the pivot point and the second contact point;
    a socket; and
    a microelectronic package having a specific size between the arm and the socket, the first contact point being positioned to apply a first force to the package according to a first moment arm length, and the second contact point being positioned to apply a second force to the package according to a second moment arm length, one of the contact points being in contact with the package to apply a force to the package when the other contact point is not in contact with the package.

12. The assembly of claim 11 wherein the package comprises a microprocessor package.

13. The assembly of claim 11 wherein the latch is formed from a glass-filled plastic.

14. The assembly of claim 11 wherein the latch is formed from one or more of plastic, vinyl, polyethylene styrene, and polyetherimide.

15. The assembly of claim 11 wherein the socket comprises a universal socket.

16. The assembly of claim 11 wherein the socket comprises a self captivating socket.

17. The assembly of claim 11, further comprising a second latch comprising:
    a second arm;
    a plurality of contact points on the second arm; and
    a second pivot point, the second latch being rotatable about the second pivot point.

18. The assembly of claim 11, further comprising a spring coupled to a notched tab in the latch, the pivot point being between the notched tab and the first and second contact points, the spring to cause the first contact point or the second contact point to apply a substantially vertical force to the package to hold the package on the socket with electrical continuity between the package and the socket.

19. The assembly of claim 11, further comprising an actuating arm coup led to the latch, and a lid coupled to the actuating arm.

20. The assembly of claim 11 wherein the latch is approximately 10 millimeters in length.

21. The assembly of claim 11, further comprising a third contact point on the arm.

22. A latch for use wit a socket for receiving variably sized microelectronic devices, the latch comprising:
    a body;
    a tab formed on the body;
    a lever arm formed on the body, wherein the lever arm is formed substantially opposite said tab;
    a fixed pivot point formed on the body;
    a plurality of contact points formed on the lever arm, each contact point to be in contact with and to apply a force to a specifically sized microelectronic device located on the socket when the other contact points are not in contact with the microelectronic device; and
    a spring coupled to the tab to cause the lever arm to apply a substantially vertical force to the microelectronic device to hold the microelectronic device on the socket with electrical continuity between the microelectronic device and the socket.

23. The latch of claim 22, wherein the latch is substantially formed from glass-filled plastic.

24. The latch of claim 22, wherein said latch is configured to provide socketing force to a microelectronic package.

25. The latch of claim 22, wherein said latch has two contact points.

26. The latch of claim 22, wherein said plurality of contact points are configured to socket microelectronic devices of different physical dimensions.

27. The latch of claim 22, further including one or more springs coupled to said body, an actuating arm coupled to said body, and a lid coupled to said actuating arm.

28. The latch of claim 22, wherein said latch is one component of a bum-in socket assembly.

29. The latch of claim 22, wherein said pivot point is formed on said body between said tab and said lever arm.

30. The latch of claim 22, wherein said contact points comprise a first contact point and a second contact point, the first contact point being located between the pivot point and the second contact point.

31. An assembly for receiving variably sized microelectronic packages comprising:
- a latch comprising:
  - an arm;
  - a first contact point on the arm;
  - a second contact point on the arm;
  - a pivot point, the arm being rotatable about the pivot point, the first contact point being located between the pivot point and the second contact point;
- a socket;
- a microelectronic package having a specific size between the arm and the socket, the first contact point being positioned to apply a first force to the package according to a first moment arm length, and the second contact point being positioned to apply a second force to the package according to a second moment arm length, one of the contact points being in contact with the package to apply a force to the package when the other contact point is not in contact with the package; and
- a spring coupled to a notched tab in the latch, the pivot point being between the notched tab and the first and second contact points, the spring to cause the first contact point or the second contact point to apply a substantially vertical force to the package to hold the package on the socket with electrical continuity between the package and the socket.

32. The assembly of claim 31 wherein the package comprises a microprocessor package.

33. The assembly of claim 31 wherein the latch is formed from a glass-filled plastic.

34. The assembly of claim 31 wherein the latch is formed from one or more of plastic, vinyl, polyethylene styrene, and polyetherimide.

35. The assembly of claim 31 wherein the socket comprises a universal socket.

36. The assembly of claim 31 wherein the socket comprises a self-captivating socket.

37. The assembly of claim 31, further comprising a second latch comprising:
- a second arm;
- a plurality of contact points on the second arm; and
- a second pivot point, the second latch being rotatable about the second pivot point.

38. The assembly of claim 31, further comprising an actuating arm coupled to the latch, and a lid coupled to the actuating arm.

39. The assembly of claim 31 wherein the latch is approximately 10 millimeters in length.

40. The assembly of claim 31, further comprising a third contact point on the arm.

* * * * *

UNITED STATES PATENT AND TRADEMARK OFFICE
CERTIFICATE OF CORRECTION

PATENT NO. : 7,160,127 B2
APPLICATION NO. : 10/391893
DATED : January 9, 2007
INVENTOR(S) : Brand It is certified that error appears in the above-identified patent and that said Letters Patent is hereby corrected as shown below:

In column 5, line 36, in Claim 7, delete "bum-in" and insert -- burn-in --, therefor.

In column 6, line 11, in Claim 16, delete "self captivating" and insert -- self-captivating --, therefor.

In column 6, line 33, in Claim 22, delete "wit" and insert -- with --, therefor.

In column 6, line 65, in Claim 28, delete "bum-in" and insert -- burn-in --, therefor.

Signed and Sealed this

Twenty-sixth Day of June, 2007

JON W. DUDAS
*Director of the United States Patent and Trademark Office*